United States Patent [19]

Mori

[11] Patent Number: 4,500,365
[45] Date of Patent: Feb. 19, 1985

[54] LASER TREATING IMPLANTED SEMICONDUCTOR SURFACE THROUGH PHOTO-RESIST LAYER

[75] Inventor: Haruhisa Mori, Yokohama, Japan

[73] Assignee: Fujitsu Limited, Kawasaki, Japan

[21] Appl. No.: 467,188

[22] Filed: Feb. 16, 1983

Related U.S. Application Data

[63] Continuation of Ser. No. 204,907, Nov. 7, 1980, abandoned.

[30] Foreign Application Priority Data

Nov. 12, 1979 [JP] Japan ............................ 54-146347

[51] Int. Cl.³ ........................................ H01L 21/263
[52] U.S. Cl. ................................. 148/1.5; 29/576 T; 148/187; 357/91; 427/53.1
[58] Field of Search ............... 148/1.5, 187; 427/53.1; 357/91; 29/576 T

[56] References Cited

U.S. PATENT DOCUMENTS

| | | | |
|---|---|---|---|
| 3,660,171 | 5/1972 | Tsuchimoto et al. | 148/1.5 |
| 3,852,119 | 12/1974 | Gosney et al. | 148/1.5 |
| 4,193,183 | 3/1980 | Klein | 29/578 |
| 4,289,381 | 9/1981 | Garvin et al. | 156/643 |
| 4,335,198 | 6/1982 | Hanada et al. | 427/53.1 |

OTHER PUBLICATIONS

Fowler et al., IBM-TDB, 22 (May 1980), pp. 5473-5474.
Sealy et al., In AIP Conf. Proceedings #50, ed. Ferris et al., Laser-Solid Interactions . . . , 1978, N.Y., p. 610.

Primary Examiner—Roy Upendra
Attorney, Agent, or Firm—Staas & Halsey

[57] ABSTRACT

A method of manufacturing a semiconductor device wherein a surface region of a semiconductor substrate is selectively heated by irradiation of a laser beam of a wavelength $\lambda$. The method includes the steps of opening a window through an insulating layer formed on the surface of the semiconductor substrate, coating on the entire surface of the substrate a light transmitting film having an index n of refraction in such a manner that the thickness of the film over the exposed window part is equal, or substantially equal, to the value of $\lambda/4n$ or $\lambda/4n$ times an odd number, and then carrying out the irradiation of the laser beam. A photo-resist, thermally grown silicon dioxide film, silicon dioxide film by chemical vapor deposition, CVD phosphosilicate glass, or a glass film formed by coating hydroxide of silicon or its high molecule polymer is employed as the light transmitting film.

7 Claims, 5 Drawing Figures

LASER TREATING IMPLANTED SEMICONDUCTOR SURFACE THROUGH PHOTO-RESIST LAYER

This is a continuation of application Ser. No. 204,907 filed Nov. 7, 1980, now abandoned.

BACKGROUND OF THE INVENTION

This invention relates to a method of manufacturing a semiconductor device, and more particularly to a method to prevent damage to those parts other than the part to be annealed by selectively heat treating or annealing a silicon semiconductor substrate using irradation of a laser beam.

Where a semiconductor substrate, a silicon substrate for example, is annealed by irradiation of a laser beam, the rate or amount of incident beam of the laser at part of the exposed substrate is different from that at part of the substrate which is covered by an insulating film, such as silicon dioxide ($SiO_2$). Where laser beam L is irradiated simultaneously, as shown in FIG. 1, onto area A of a silicon semiconductor substrate 1 and area B of substrate 1 which is covered by a film 2 of $SiO_2$, one might assume that the amount of incident beam of laser L which penetrates into area A is larger than that which enters into area B because area B is covered with the $SiO_2$ film 2. What happens is quite to the contrary, however and in some instances, the part of substrate 1 in area B is physically damaged. Upon investigation of this, it was determined that $SiO_2$ film 2 functions as a cover to prevent reflection of the laser beam.

It was thus confirmed that the amount of incident beam of laser L that penetrates into the substrate 1 in area A is always less than that in area B. It was further found that the effectiveness of the film 2 in preventing reflection of laser beam L depends on the thickness of $SiO_2$ film 2 as well as the wavelength of laser beam L.

Such a relationship is illustrated by a sine wave curve shown in FIG. 2 in which the abscissa represents film thickness t of $SiO_2$, film 2 expressed relative to the wavelength of laser beam L, and the ordinate represents the rate of incident beam of laser L that penetrates into the substrate 1. In other words, To represents the power (or quantity) of the incident beam of laser L that penetrates into the substrate 1 where there is no film of $SiO_2$, T represents such power (or quantity) where the substrate 1 is covered with $SiO_2$ film 2, and the ordinate represents the ratio T/To.

Therefore, where there is no film of $SiO_2$, that is, where t=0, T/To=1. As will be apparent from FIG. 2, where $SiO_2$ is formed on the substrate 1, the ratio of penetration, T/To takes a maximum value of approximately 1.3~1.4 times that value when t=0. This peak value appears where film thickness t is $$t = \lambda/4n$$

or its odd number multiple, where

λ is the wavelength of laser L, and
n is the index of refraction.
For example, with a YAG (yttrium-aluminum-garnet) laser of λ=10600 Å, $$t = \lambda/4n = 10600 \text{ Å}/(4 \times 1.46) \approx 1800 \text{ Å}$$

because the index n of refraction of $SiO_2$ is $$n = 1.46.$$

That is to say, the first peak value appears where $t \approx 1800$ Å, the second peak appearing at $$t = 3\lambda/4n = 5400 \text{ Å}.$$

Even where t>0, T/To=1 if film thickness t is equal to λ/2n or its natural number multiple. In any area other than the one just described, $$T/To > 1$$

so that the density of energy of incident beam of the laser entering into area B which is covered with $SiO_2$ film 2 is larger than the energy density in area A as shown by circled A and B in FIG. 2. This is the cause of technical disadvantages as will now be described.

Where the film 2 of $SiO_2$ shown in FIG. 1 is used as a mask when forming a region 3 by ion implantation and said region 3 is an area A that is desired to be annealed, it cannot be avoided that part of laser beam L is irradiated onto area B when it is irradiated onto the region 3 in order to anneal said region 3 which is in an amorphous state. In such a case, the length of time of laser irradiation and other conditions are established so as to best suit the annealing purpose. If thickness t of $SiO_2$ film 2 is not λ/2n times, a natural multiple number thereof or is not near such a value, there would be excessive irradiation of the laser beam onto area B by the time annealing of area A has been completed. This causes damage to the substrate 1 in area B as was mentioned before.

SUMMARY OF THE INVENTION

It is therefore the general object of the present invention to solve the technical problems experienced in the prior art by positively utilizing the function of preventing reflection which an insulating film formed on a semiconductor substrate exhibits.

In an embodiment of the invention, a window is opened through an insulating layer formed on the surface of a semiconductor substrate, and when the beam of the laser of the wavelength λ is to be irradiated on that part of the substrate thus exposed, a light transmitting material having the index n of refraction is caused to cover the entire surface of the semiconductor substrate in such a manner that the thickness of the light transmitting material on the part where the substrate is exposed is equal to, or substantially equal to, the value λ/4n or its odd number multiple.

In one embodiment, the material used to cover the semiconductor substrate is a negative photoresist having the index of refraction, n=1.48.

In other embodiments, the material covering the semiconductor substrate is silicon dioxide, phosphosilicate glass, or glass film formed by coating hydroxide of silicon or its high molecule polymer, then heating the same at about 150° C.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

Figure 1:
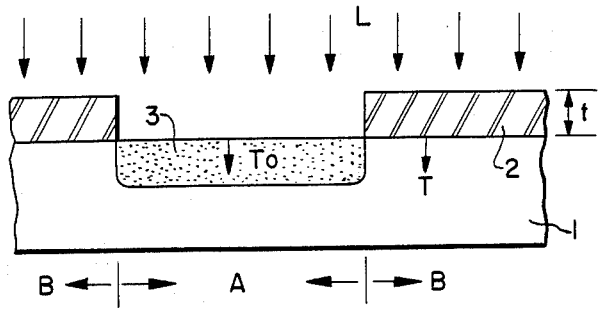
FIG. 1 is a cross-sectional view illustrating the mode of laser annealing according to the prior art technology.
Figure 2:
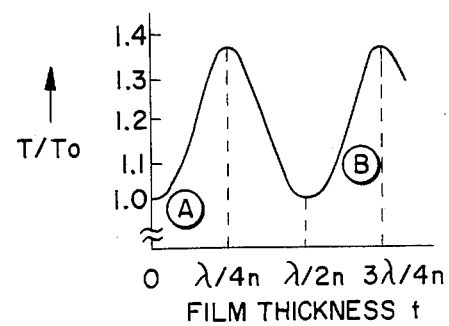
FIG. 2 is a graph with a sine wave showing functional characteristics of silicon dioxide film to prevent reflection of light.
Figure 3:
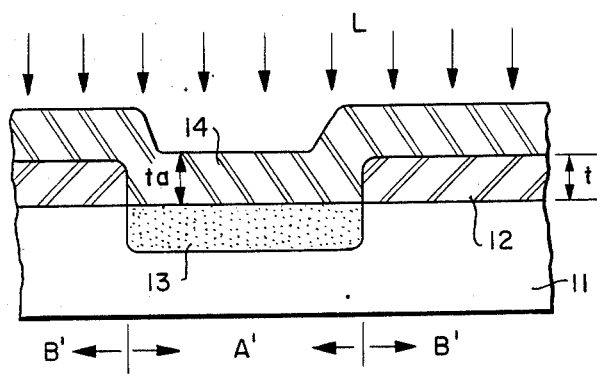
FIG. 3 is a cross-sectional view illustrating a mode to carry out an embodiment of the invention.
Figure 4:
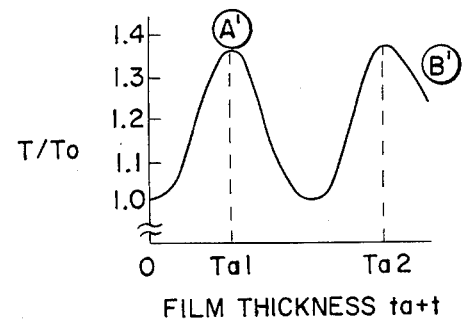
FIG. 4 is a graph with a sine wave similar to that of FIG. 2 where a light transmitting material according to the invention is used.

FIG. 3 shows in cross-section a mode of carrying out an embodiment of the invention, and those parts similar to those appearing in FIG. 1 are referenced alike. In the method of the invention, a light transmitting material 14 having the thickness of a value equal to, or substantially equal to, $ta = \lambda/4n$, or its odd number multiple is applied over area A' which is to be annealed, and then laser beam L is irradiated onto the area A'. In the above expression, $\lambda$ is the wavelength of laser L and n is the index of refraction of the light transmitting material 14. In the same manner as was explained with reference to FIG. 2, where the light transmitting material 14 having the thickness of a value equal to, or substantially equal to, $ta = \lambda/4n$ or its odd number multiple is applied on the surface of the region 13 formed by ion implantation, then the ratio $T/To$, that is the rate of incident beam of laser penetrating into the region 1e, takes the maximum value as shown in FIG. 4. It should be noted here that, since the relationship between film thickness ta and ratio $T/To$ of FIG. 4 is expressed by a sine wave, slight changes in the value of ta near the peak has very little effect to the ratio $T/To$.

In FIG. 4, $ta_1$ and $ta_2$ correspond to $\lambda/4n$ and $3\lambda/4n$ respectively. The light transmitting material is applied to cover the entire surface of semiconductor substrate 11, so that the material 14 also covers the insulating film 12 of silicon dioxide ($SiO_2$) in area B'. Thus, the thickness of the layers on the substrate 11 in area B', namely the total thickness of $SiO_2$ film 12 and the light transmitting material 14 is larger than the value of $ta = \lambda/4n$, which means, as will be apparent from FIG. 4, that the value of $T/To$ is less than the maximum value generally. In other words, the power of the incident beam of the laser which penetrates into the semiconductor substrate 11 in area B' is subject to the rate of penetration depending on the thickness of the light transmitting material 14 and that of $SiO_2$ film 12. However, the thickness of the light transmitting material 14 has been established such that the amount of the incident beam of laser L penetrating into the substrate 11 takes the maximum value independently so that the value of $T/To$ in area B' where the thickness of $SiO_2$ film 12 is added to the thickness of the light transmitting material 14 is far less than that of area A' as shown by circled A' and B' in FIG. 4. Even if $T/To$ in area B' reaches a peak value, it is equal to the peak value in area A', which means that irradiation of laser L suitable for annealing of the region 13 for a predetermined length of time would not damage the substrate 11 in area B'.

Figure 5:
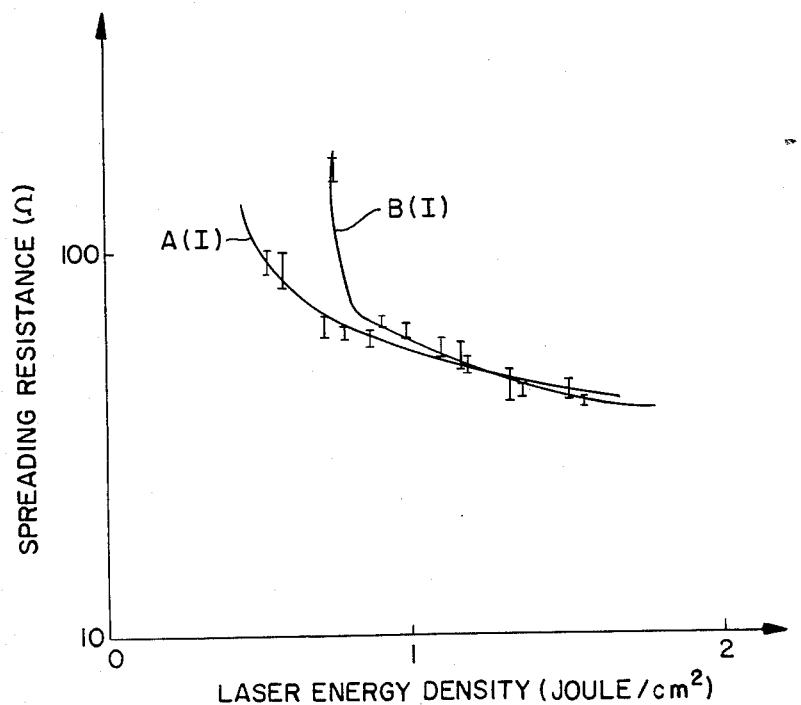
FIG. 5 is a graph with the relationship between the laser energy density and spreading resistance in the two embodiments of FIG. 1 and FIG. 3 respectively.

FIG. 5 illustrates the relationship between the laser energy density and the spreading resistance of the region 13. In this described embodiment, the semiconductor substrate 11 is a p conductivity type silicon substrate and the silicon substrate 11 has a resistivity of 3Ω-cm. The silicon dioxide film 12 is grown on the silicon substrate 11 by thermal oxidation and has a thickness of 8000 Å. The silicon dioxide film 12 is then selectivity etched by the photolithography technique to provide a window opening.

Arsenic (As) ion is implanted into said silicon substrate 11 with energy of 50 Kev at a dose of $5 \times 10^{15}$ atoms/cm$^2$ to form the ion implanted region 13 in the silicon substrate 11. A negative photoresist OMR-83, a product of Tokyo Oka Co., Ltd. is then coated on the silicon substrate 11, and baked to form the negative photoresist layer 14 on the silicon substrate 11, which has a thickness of 1090 Å and an index of refraction of $n = 1.48$. Finally, the laser beam L of a ruby laser ($\lambda = 6943$ Å) is irradiated on the silicon substrate.

Curve A in FIG. 5 followed by bold I in brackets shows the case where the region 13 is covered with a negative photoresist. Curve B in FIG. 5 followed by I in brackets is the case where the region 13 was uncovered. The fact that curve A(I) is offset to the left relative to the curve B(I) shows that the region 13, when covered with the photoresist receives so much more energy than when it is exposed. This indicates the effect of preventing reflection of light. On the other hand, the energy density which causes the damage to the $SiO_2$ film 12 is almost at the same level in the two cases.

In addition to the photoresist, silicon dioxide ($SiO_2$) thermally grown at 900° C. or more, $SiO_2$ film by chemical vapour deposition (CVD) at about 800° C., phosphosilicate glass (PSG) film by CVD, or glass film formed by coating hydroxide of silicon or its high molecule polymer, then heating the same at about 150° C., may be employed as a light transmitting material 14. However, since it is undesirable to interpose a heat treatment between the stages of ion implantation and laser annealing which has the effect of curing crystals of the region 13, a process of applying or coating the light transmitting material 14 that requires heat treatment at 500° C. or more should be avoided.

In other words, the part, such as the region 13, that has been damaged and turned amorphous has a higher rate of absorbing laser L than the ordinary or the monocrystal part, and it effectively absorbs incident beams of the laser L that enters thereinto from the surface. Thus, if the region 13 is in an amorphous state, laser beam is convergently absorbed by that part to realize heating. But, as the crystallinity is recovered, the rate of absorbing the laser beam is lowered, laser energy penetrates deep into the substrate, the energy per unit volume decreases, and annealing is not effected significantly. If laser energy is convergently absorbed in the region 13, good electric characteristics, such as junction leak current, may be obtained. However, if laser energy is widely dispersed within the substrate with a part thereof being absorbed in the region 13, adverse effects to electric characteristics are created. Because of these reasons, it is undesirable that the crystallinity of the region 13 recovers before irradiation of the laser beam takes place. Therefore, thermally grown silicon dioxide ($SiO_2$) film, CVD $SiO_2$ film, etc. should be formed before the process of ion implantation so that implantation of ions is carried out through the film already formed. Since any of these light transmitting materials have insulating characteristics, they can be used as an insulating layer or a mask in subsequent processes.

As has been described so far, laser annealing can be selectively and accurately performed at desired places according to the method of the invention without damaging the semiconductor substrate at places other than the desired place.

Thus, the invention having been described in its best embodiment and mode of operation, that which is desired to be protected by Letters Patent is:

I claim:

1. A method of manufacturing a semiconductor device wherein an ion implanted surface region of a semiconductor substrate is heated by irradiating with a laser beam of wavelength $\lambda$, said method comprising the steps of:
   (a) selectively placing an impurity into said semiconductor substrate by ion implantation using an insulating layer as a mask;
   (b) forming a light transmitting film, comprising a photoresist and having a refraction index n, on said ion implanted surface region of the semiconductor substrate and on the insulating layer formed on the non-implanted surface of the semiconductor substrate, said light transmitting film having a uniform thickness defined by $m\lambda/4n$, where m is an odd natural number; and
   (c) irradiating said laser beam through said light transmitting film for selectively heating and activating said ion implanted surface region of the semiconductor substrate.

2. The method of claim 1, wherein the step of ion implanting ions into the semiconductor substrate through said film is subsequent to forming said light transmitting film.

3. In a method of manufacturing a semiconductor device having the steps of opening a window through an insulating layer formed on the surface of a semiconductor substrate, and then irradiating a laser beam of a wavelength $\lambda$ onto the part of the semiconductor substrate thus exposed to heat selectively the irradiated part, the method further comprising the steps of:
   extensively covering the exposed surface of said semiconductor substrate and said insulating layer formed on the non-implanted surface of the semiconductor substrate with a light transmitting film comprising a photoresist and having an index of refraction n, said film being applied such that its thickness is uniform and equal, or substantially equal, to the value of $\lambda/4n$ or $\lambda 4/n$ times an odd number, and thereafter
   carrying out irradiation of said laser beam through said light transmitting film for selectively heating the exposed window surface of the semiconductor substrate.

4. A method of manufacturing a semiconductor device wherein a surface region of a semiconductor substrate is selectively heated by irradiation of a laser beam of a wavelength $\lambda$, the method comprising the steps of:
   (a) forming a insulating layer on the surface of the semiconductor substrate;
   (b) opening a window through the insulating layer formed on the semiconductor substrate;
   (c) selectively inplanting ions into the exposed window region of the semiconductor substrate using the insulating layer as a mask;
   (d) forming a light transmitting film, comprising a photoresist over the exposed surface of the semiconductor substrate and over the insulating layer formed on the non-ion implanted surface region of the semiconductor substrate, said light transmitting film having a index n of refraction and formed such that its thickness is uniform and equal, or substantially equal, to the value $\lambda/4n$ or an odd multiple thereof; and
   (e) irradiating the surface of the semiconductor substrate with the laser beam of the wavelength $\lambda$ through the light transmitting film for selectively heating and activating said ion implanted region.

5. The method of claim 4, wherein said light transmitting film is a negative photoresist.

6. The method of claim 5, wherein said insulating layer is a silicon dioxide insulating film.

7. The method of claim 6, wherein the step of forming the window through the insulating layer comprises selectively etching the silicon dioxide insulating film.

* * * * *

UNITED STATES PATENT AND TRADEMARK OFFICE
CERTIFICATE OF CORRECTION

PATENT NO. : 4,500,365
DATED : February 19, 1985
INVENTOR(S) : Mori

It is certified that error appears in the above-identified patent and that said Letters Patent is hereby corrected as shown below:

Column 3, line 36, "$1_e$" should be --13--.

Signed and Sealed this

Twenty-third Day of July 1985

[SEAL]

Attest:

DONALD J. QUIGG

Attesting Officer     Acting Commissioner of Patents and Trademarks